(12) United States Patent
Lee et al.

(10) Patent No.: US 11,637,175 B2
(45) Date of Patent: Apr. 25, 2023

(54) VERTICAL TRANSISTORS

(71) Applicant: Micron Technology, Inc., Boise, ID (US)

(72) Inventors: Yi Fang Lee, Boise, ID (US); Hung-Wei Liu, Meridian, ID (US); Ning Lu, Boise, ID (US); Anish A. Khandekar, Boise, ID (US); Jeffery B. Hull, Boise, ID (US); Silvia Borsari, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 10 days.

(21) Appl. No.: 17/116,120

(22) Filed: Dec. 9, 2020

(65) Prior Publication Data
US 2022/0181434 A1 Jun. 9, 2022

(51) Int. Cl.
*H01L 29/04* (2006.01)
*H01L 29/786* (2006.01)

(52) U.S. Cl.
CPC ........ *H01L 29/04* (2013.01); *H01L 29/78642* (2013.01)

(58) Field of Classification Search
CPC .................. H01L 29/04; H01L 29/78642
USPC ......................................................... 257/43
See application file for complete search history.

(56) References Cited

U.S. PATENT DOCUMENTS

| | | | |
|---|---|---|---|
| 6,049,106 A * | 4/2000 | Forbes | H01L 29/78642 257/329 |
| 6,617,644 B1 | 9/2003 | Yamazaki et al. | |
| 6,903,372 B1 | 6/2005 | Yamaguchi et al. | |
| 8,034,671 B2 | 10/2011 | Peng et al. | |
| 8,513,722 B2 | 8/2013 | Tang et al. | |
| 9,646,869 B2 | 5/2017 | Tang et al. | |
| 2001/0046755 A1 | 11/2001 | Hara et al. | |
| 2002/0052069 A1 | 5/2002 | Jiroku et al. | |
| 2002/0100909 A1 | 8/2002 | Yamaguchi et al. | |

(Continued)

FOREIGN PATENT DOCUMENTS

| EP | 0901169 | 3/1999 |
|---|---|---|
| JP | 4583529 | 11/2010 |

(Continued)

OTHER PUBLICATIONS

U.S. Appl. No. 16/536,544, filed Aug. 9, 2019, by Nahar et al.

(Continued)

*Primary Examiner* — Sheikh Maruf
(74) *Attorney, Agent, or Firm* — Wells St. John P.S.

(57) ABSTRACT

A vertical transistor comprises a top source/drain region, a bottom source/drain region, a channel region vertically between the top and bottom source/drain regions, and a gate operatively laterally-adjacent the channel region. The top source/drain region and the channel region have a top interface and the bottom source/drain region and the channel region have a bottom interface. The channel region is crystalline and has an average crystal grain size of its crystal grains that is less than 20 nanometers. The channel region at the top interface or at the bottom interface has greater horizontal texture than volume of the crystal grains in the channel region that is vertically between the crystal grains that are at the top and bottom interfaces. Other embodiments and aspects are disclosed.

28 Claims, 17 Drawing Sheets

(56) References Cited

U.S. PATENT DOCUMENTS

| | | | |
|---|---|---|---|
| 2003/0003766 A1 | 1/2003 | Kumomi et al. | |
| 2003/0102508 A1 | 6/2003 | Lee | |
| 2003/0211666 A1 | 11/2003 | Okumura | |
| 2004/0085268 A1 | 5/2004 | Kim et al. | |
| 2005/0020096 A1* | 1/2005 | Miyairi | H01L 21/02529 |
| | | | 257/E29.295 |
| 2005/0255679 A1* | 11/2005 | Yamaguchi | H01L 21/02691 |
| | | | 438/164 |
| 2006/0177361 A1 | 8/2006 | Kumomi | |
| 2007/0228449 A1 | 10/2007 | Takano et al. | |
| 2009/0269892 A1* | 10/2009 | Hatano | H01L 29/04 |
| | | | 438/22 |
| 2009/0321737 A1* | 12/2009 | Isa | H01L 27/1214 |
| | | | 257/66 |
| 2010/0044702 A1* | 2/2010 | Urayama | H01L 29/7869 |
| | | | 257/43 |
| 2010/0163821 A1 | 7/2010 | Ohashi | |
| 2011/0017990 A1* | 1/2011 | Son | H01L 29/7869 |
| | | | 257/E29.296 |
| 2011/0068418 A1 | 3/2011 | Lung | |
| 2012/0100675 A1* | 4/2012 | Komatsu | H01L 21/02595 |
| | | | 438/479 |
| 2012/0125432 A1 | 5/2012 | Matsui et al. | |
| 2012/0154346 A1 | 6/2012 | Hirose | |
| 2012/0217500 A1* | 8/2012 | Park | H01L 29/78669 |
| | | | 257/E33.053 |
| 2013/0056742 A1* | 3/2013 | Tezuka | H01L 21/02595 |
| | | | 438/479 |
| 2013/0126869 A1 | 5/2013 | Kanegae et al. | |
| 2013/0143395 A1* | 6/2013 | Shieh | H01L 29/24 |
| | | | 438/482 |
| 2014/0054579 A1 | 2/2014 | Kim et al. | |
| 2014/0141579 A1 | 5/2014 | Tian et al. | |
| 2014/0225184 A1 | 8/2014 | Colinge et al. | |
| 2014/0264353 A1 | 9/2014 | Lai | |
| 2014/0374743 A1 | 12/2014 | Yamazaki | |
| 2015/0044833 A1 | 2/2015 | Lee et al. | |
| 2015/0084043 A1 | 3/2015 | Ishihara et al. | |
| 2015/0340631 A1 | 11/2015 | Rinzler et al. | |
| 2016/0035741 A1 | 2/2016 | Tajima et al. | |
| 2016/0099250 A1* | 4/2016 | Rabkin | H01L 29/40114 |
| | | | 257/66 |
| 2016/0284765 A1 | 9/2016 | Takeguchi et al. | |
| 2017/0033175 A1 | 2/2017 | Oda et al. | |
| 2017/0062466 A1 | 3/2017 | Ishizaki | |
| 2017/0077125 A1* | 3/2017 | Yamasaki | H01L 29/04 |
| 2017/0082902 A1* | 3/2017 | Hirose | H01L 27/1255 |
| 2017/0235201 A1* | 8/2017 | Hirose | H01L 27/124 |
| | | | 257/59 |
| 2019/0013196 A1 | 1/2019 | Roberts et al. | |
| 2019/0013388 A1 | 1/2019 | Han et al. | |
| 2019/0067317 A1 | 2/2019 | Shioda et al. | |
| 2019/0185996 A1 | 6/2019 | Jha et al. | |
| 2020/0066513 A1 | 2/2020 | Nahar et al. | |

FOREIGN PATENT DOCUMENTS

| | | |
|---|---|---|
| KR | 10-2003-0073076 | 9/2003 |
| KR | 10-2007-0098745 | 10/2007 |
| KR | 10-2012-0037952 | 4/2012 |
| KR | 10-2014-0025224 | 3/2014 |
| WO | WO 97/45827 | 12/1997 |

OTHER PUBLICATIONS

U.S. Appl. No. 16/986,436, filed Aug. 6, 2020, by Nahar et al.
U.S. Appl. No. 16/536,479, filed Aug. 9, 2019, by Nahar et al.
U.S. Appl. No. 16/536,590, filed Aug. 9, 2019, by Liu et al.

* cited by examiner

VERTICAL TRANSISTORS

TECHNICAL FIELD

Embodiments disclosed herein pertain to vertical transistors.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated therefrom by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Field effect transistors are of course also used in integrated circuitry other than and/or outside of memory circuitry.

DETAILED DESCRIPTION OF EXAMPLE EMBODIMENTS

Figure 1:
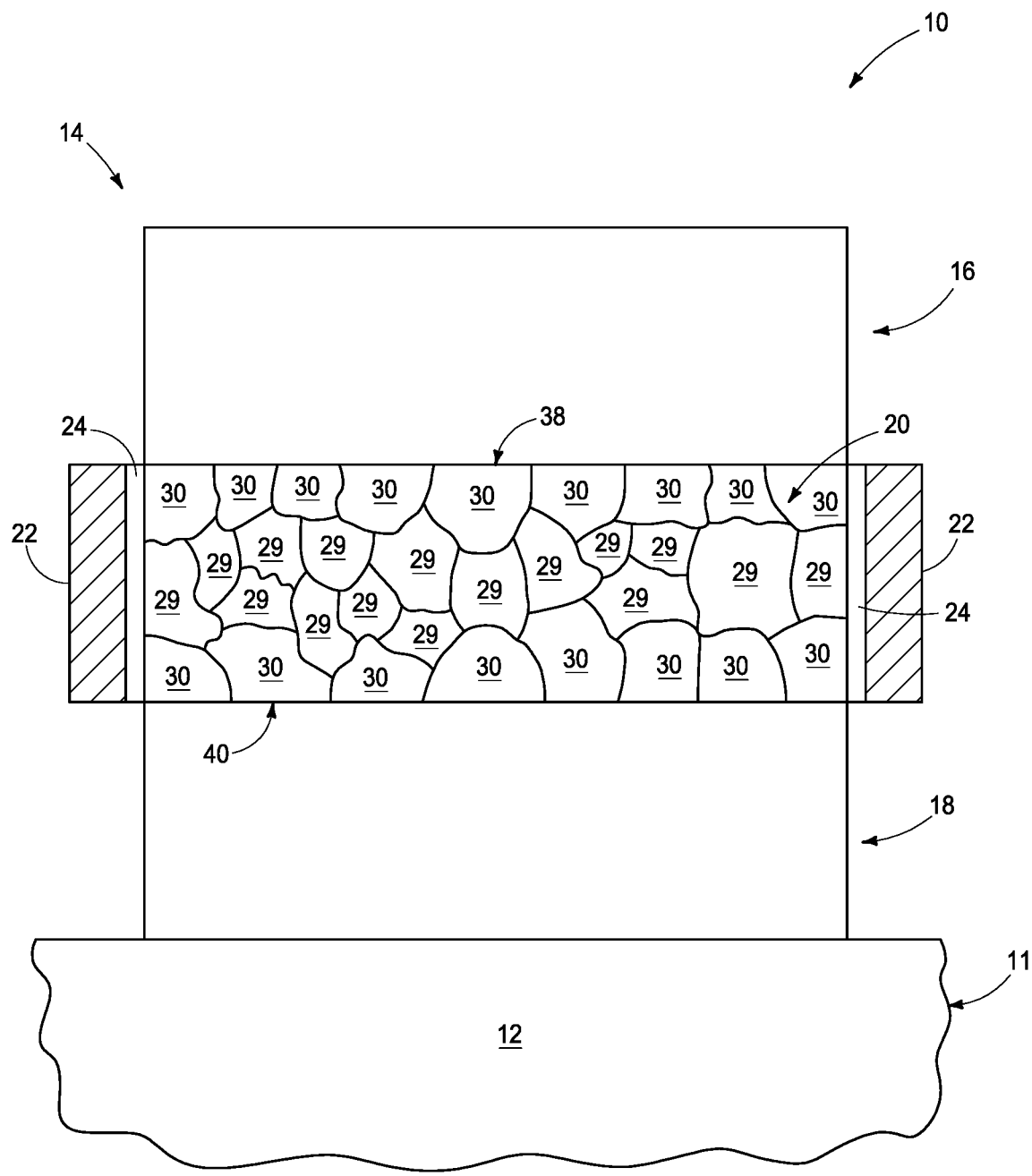
FIG. 1 is a diagrammatic sectional view of a vertical transistor in accordance with an embodiment of the invention.

An example vertical transistor 14 in accordance with an embodiment of the invention as part of a construction 10 is shown in FIG. 1. Construction 10 comprises a base substrate 11 having any one or more of conductive/conductor/conducting, semiconductive/semiconductor/semiconducting, or insulative/insulator/insulating (i.e., electrically herein) material(s) 12. Various materials have been formed elevationally over base substrate 11. Materials may be aside, elevationally inward, or elevationally outward of the FIG. 1-depicted materials. For example, other partially or wholly fabricated components of integrated circuitry may be provided somewhere above, about, or within base substrate 11. Only one vertical transistor 14 is shown, although construction 10 may comprise multiple of the same or different construction vertical transistors, for example fabricated in an array that includes multiple vertical transistors in accordance with the invention.

Vertical transistor 14 comprises a top source/drain region 16, a bottom source/drain region 18, a channel region 20 vertically between top and bottom source/drain regions 16, 18, respectively, and a gate 22 (i.e., conductive material) operatively laterally-adjacent (e.g., laterally-aside) channel region 20. A gate insulator 24 (e.g., silicon dioxide, silicon nitride, high-k material, and/or ferroelectric material) is between gate 22 and channel region 20. The example depicted components for brevity and clarity are only shown in FIG. 1 as a vertical cross-section. The example source/drain regions and channel region may be, for example, in the form of coextensive longitudinally elongated lines running into and out of the plane of the page upon which FIG. 1 lies. Alternately and by way of examples only, such may be circular, rectangular, elliptical, triangular, etc. in horizontal cross-section (not shown). Gate insulator 24 and/or gate 22 may peripherally encircle such structures or alternately, by way of example only, be only partially around such structures or only on one lateral-side in vertical cross-section (not shown). Top source/drain region 16 and channel region 20 may be considered as having a top interface 38 and bottom source/drain region 18 and channel region 20 may be considered as having a bottom interface 40. Interfaces 38 and/or 40 are shown as being flat and horizontal, although other oriented interfaces may be used, for example diagonal, a jagged and/or undulating interface, a combination of straight and curved segments, etc.

By way of examples only, regions 16, 18, and 20 may comprise one or more of appropriately-doped crystalline semiconductor material, such as one or more of silicon, germanium, and so-called III/V semiconductor materials (e.g., GaAs, InP, GaP, and GaN), with source/drain regions 16 and 18 being sufficiently doped to be conductive and channel region 20 being undoped or sufficiently doped to be semiconductive to conduct in an "on" state and to not conduct in an "off" state of the transistor. Additionally or alternately, channel region 20 may comprise an oxide semiconductor material, for example one or more of zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials. Formulae including at least one of "x," "y," "z," and "a" (e.g., $Zn_xSn_yO$, $In_xZn_yO$, $In_xGa_yZn_zO$, $In_xW_yO$, $In_xGa_ySi_zO$, $Al_xSn_yIn_zZn_aO$) represent a composite material that contains, throughout one or more regions thereof, an average ratio of "x" atoms of one element, "y" atoms of another element (if any), "z" atoms of an additional element (if any), and "a" atoms of a further element (if any) for every one atom of oxygen (O). As the formulae are representative of relative atomic ratios and not strict chemical structure, the channel material of channel region 20 may comprise one or more stoichiometric compounds and/or one or more non-stoichiometric compounds, and values of "x," "y," "z," and "a" may be integers or may be non-integers. As used herein, the term "non-stoichiometric" means and includes a chemical compound with an elemental composition that cannot be represented by a ratio of well-defined natural numbers and is in violation of the law of definite proportions.

Channel region 20 is crystalline and has an average crystal grain size that is less than 20 nanometers (average of straight-line dimensions taken through a crystal grain through its center). In this document, "crystalline" not immediately preceded by a numerical percentage or other quantifying adjective is a material, region, and/or structure that is at least 90% by volume crystalline (i.e., having at least 90% by volume crystal grains). In one embodiment, the average crystal grain size of channel region 20 is no greater than 15 nanometers, in one embodiment is no greater than 10 nanometers, in one embodiment is no less than 5 nanometers, and in one embodiment is from 5 to 10 nanometers. Channel region 20 at top interface 38 or channel region 20 at bottom interface 40 (considered individually at either interface) has greater horizontal texture than the volume of the crystal grains in channel region 20 that is vertically between the crystal grains that are at top and bottom interfaces 38, 40, respectively.

Figure 2:
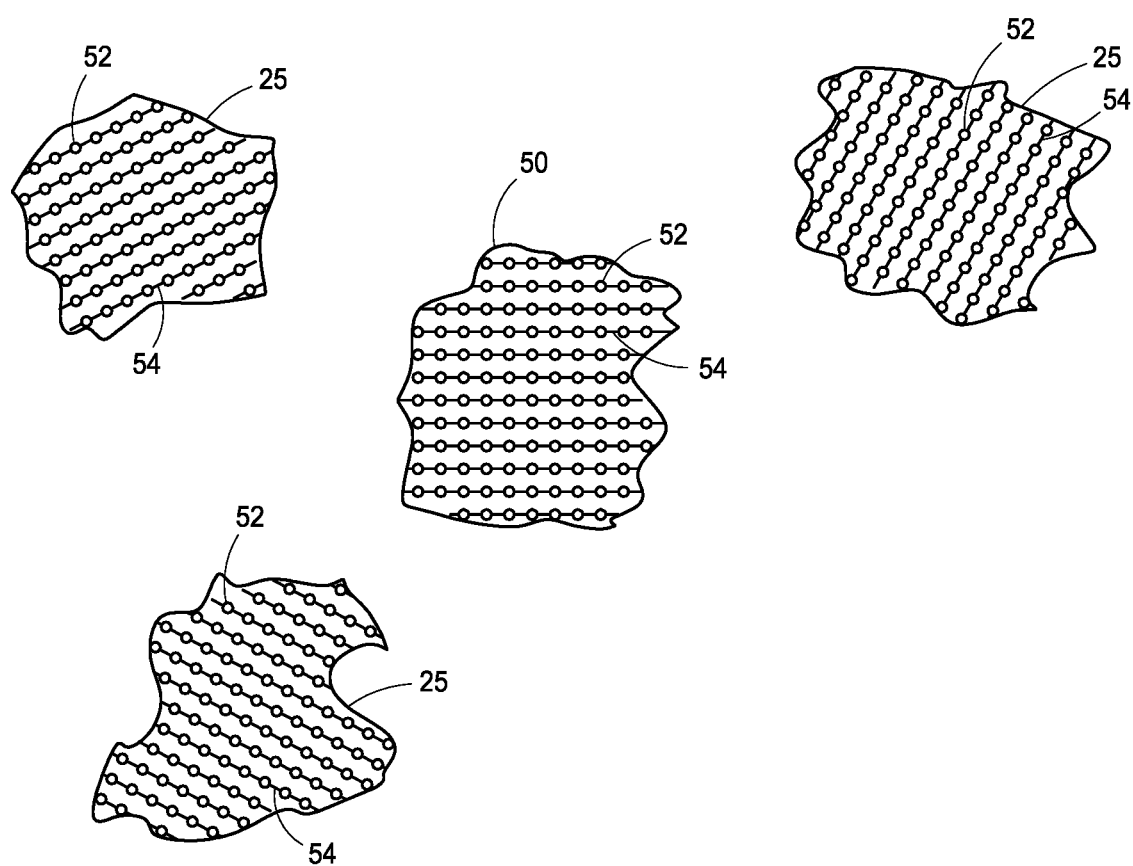
FIG. 2 is a diagrammatic representation of crystal grains.

For example, FIG. 1 shows channel region 20 as having individual crystal grains individually designated as either 30 or 29. Crystal grains 30 are characterized by having some part of at least one edge or grain boundary at one of top interface 38 or bottom interface 40, whereas crystal grains 29 are vertically between crystal grains 30 and do not have any part of an edge or grain boundary that is at either top interface 38 or bottom interface 40. FIG. 2 diagrammatically shows example individual and isolated crystal grains 25 and 50 which may comprise crystal grains 30 or 29 in FIG. 1 (meaning crystal grains 30 and 29 may internally be either a crystal grain 25 or a crystal grain 50). Crystal grains 25 and 50 are each shown as comprising lattice points 52 that may individually comprise atoms, ions, or molecules in the respective crystal grain 25 or 50 and that are arranged in crystallographic planes 54. The crystallographic planes 54 in crystal grain 50 are horizontally oriented relative to the plane of the page upon which FIG. 2 lies whereas crystallographic planes 54 in crystal grain 25 are not.

Figure 3:
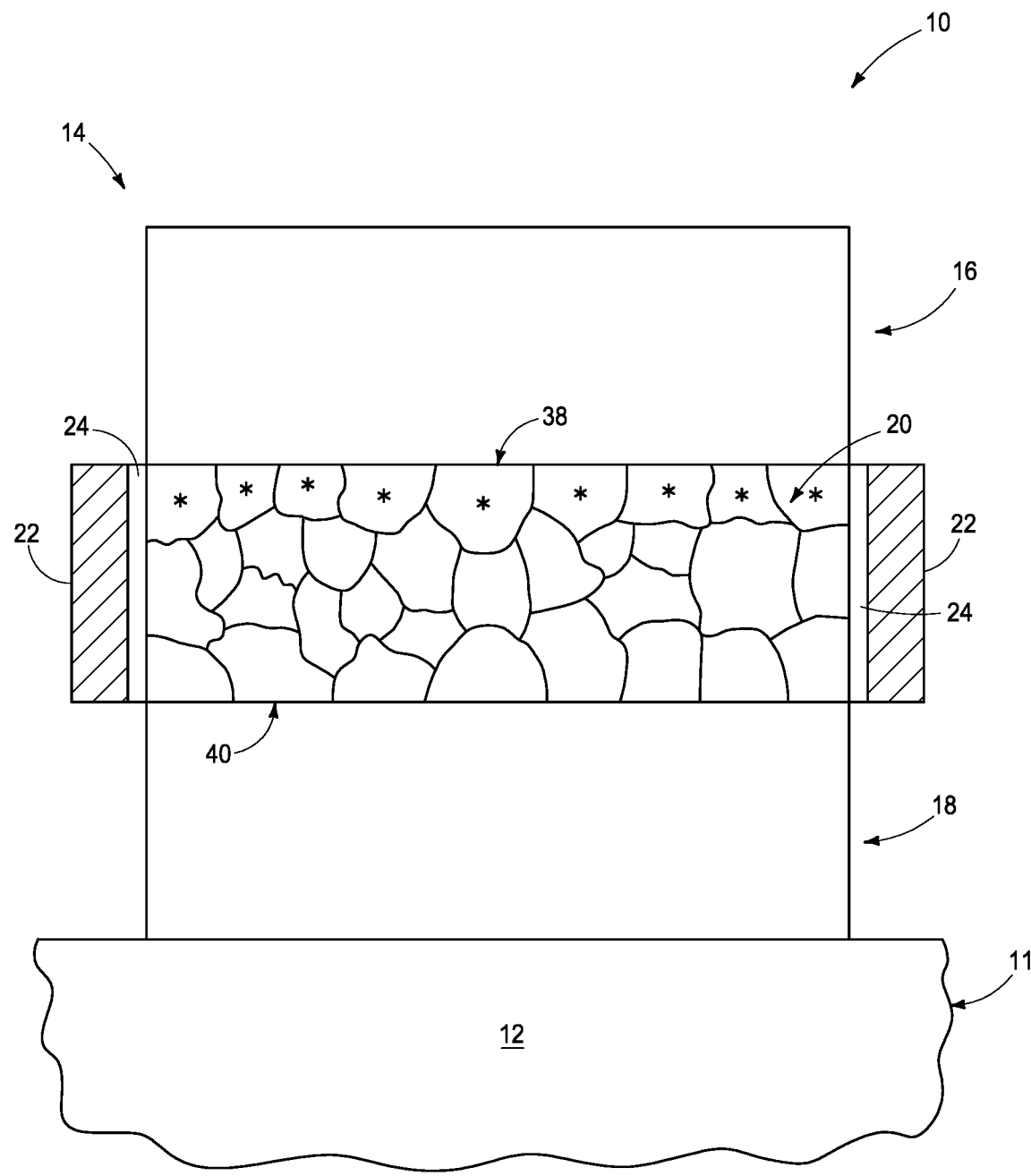
FIGS. 3-17 are diagrammatic sectional views of vertical transistors in accordance with embodiments of the invention.

FIG. 3 is the same structure as shown in FIG. 1, however with the numerals 30 and 29 having been removed from inside the depicted individual crystal grains in channel region 20. An asterisk is in those crystal grains that have their crystallographic planes horizontally oriented as shown with respect to example crystal grain 50 in FIG. 2, and with such crystallographic planes thereby being orthogonal/normal to vertical of vertical transistor 14. FIG. 3 shows an example embodiment where channel region 20 at top interface 38 has greater horizontal texture than volume of crystal grains 29 in the channel region that is vertically between crystal grains 30 that are at the top and bottom interfaces 38, 40, respectively, and regardless of whether the collective volume of crystal grains 29 is greater or smaller than collective volume of crystal grains 30 at either one interface 38 or 40. Any other attribute(s) or aspect(s) as shown and/or described herein with respect to other embodiments may be used.

Figure 4:
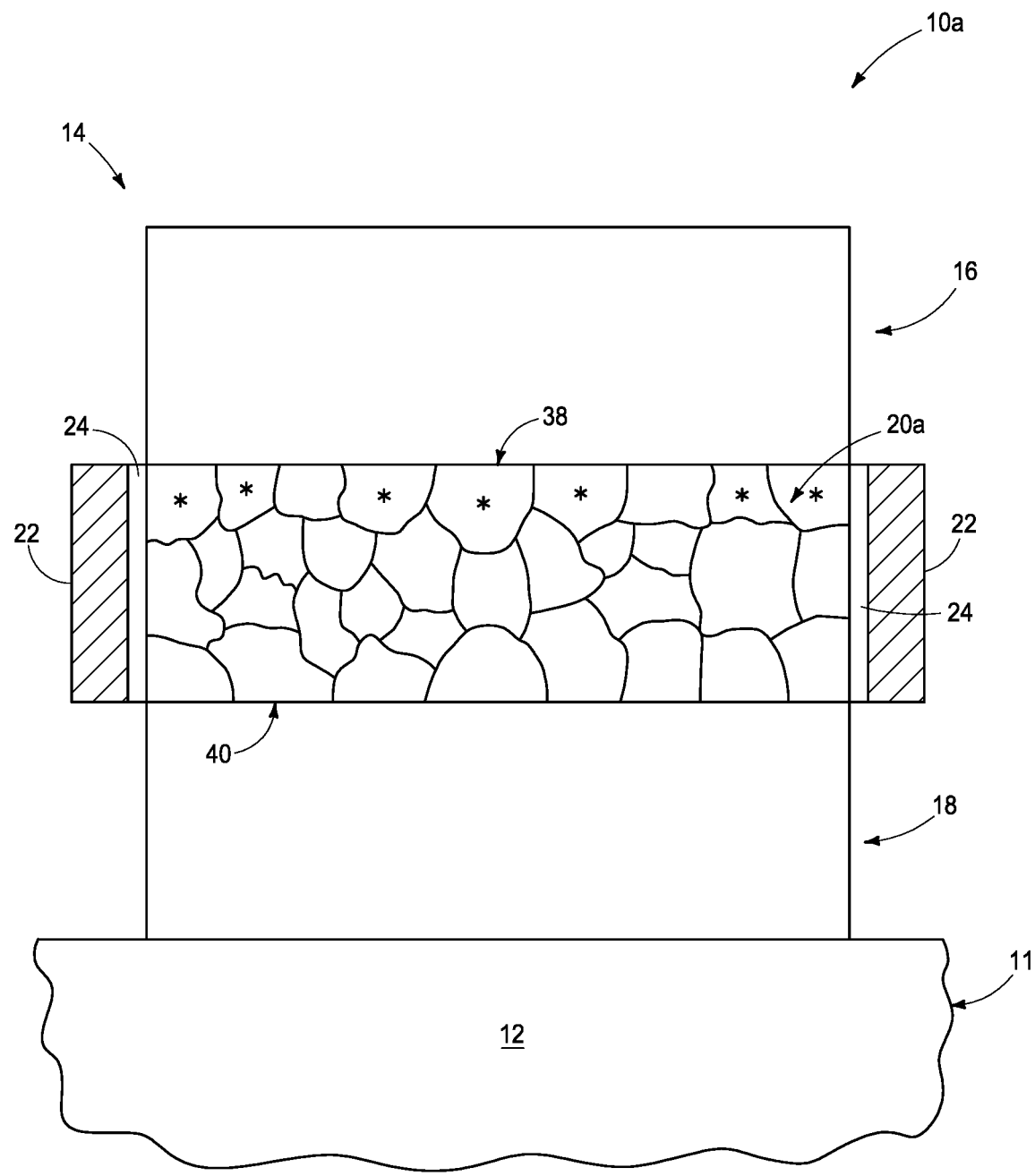

FIG. 3 also shows an example embodiment where channel region 20 at only one of top interface 38 and bottom interface 40 has the greater horizontal texture (at top interface 38). Further, and in one example, FIG. 3 shows an embodiment where all crystal grains 30 in channel region 20 at top interface 38 have horizontal texture/horizontal crystallographic planes. FIG. 4 shows an example alternate embodiment construction 10a where, by way of example, less-than-all crystal grains 30 in channel region 20a at top interface 38 have horizontal texture/horizontal crystallographic planes. Like numerals from the above-described embodiments have been used where appropriate, with some construction differences being indicated with the suffix "a" or with different numerals. Any other attribute(s) or aspect(s) as shown and/or described herein with respect to other embodiments may be used.

Figure 5:
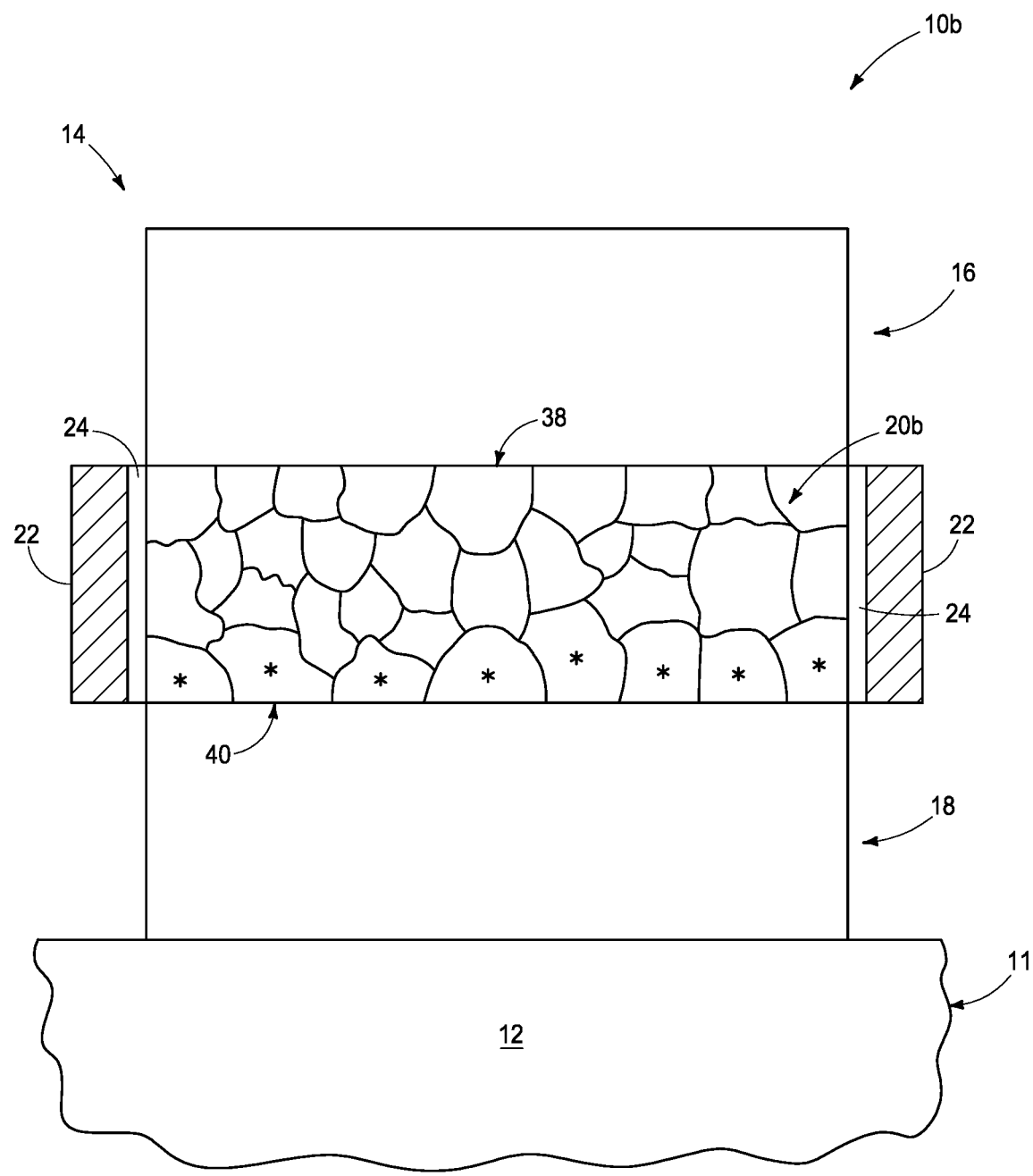
Figure 6:
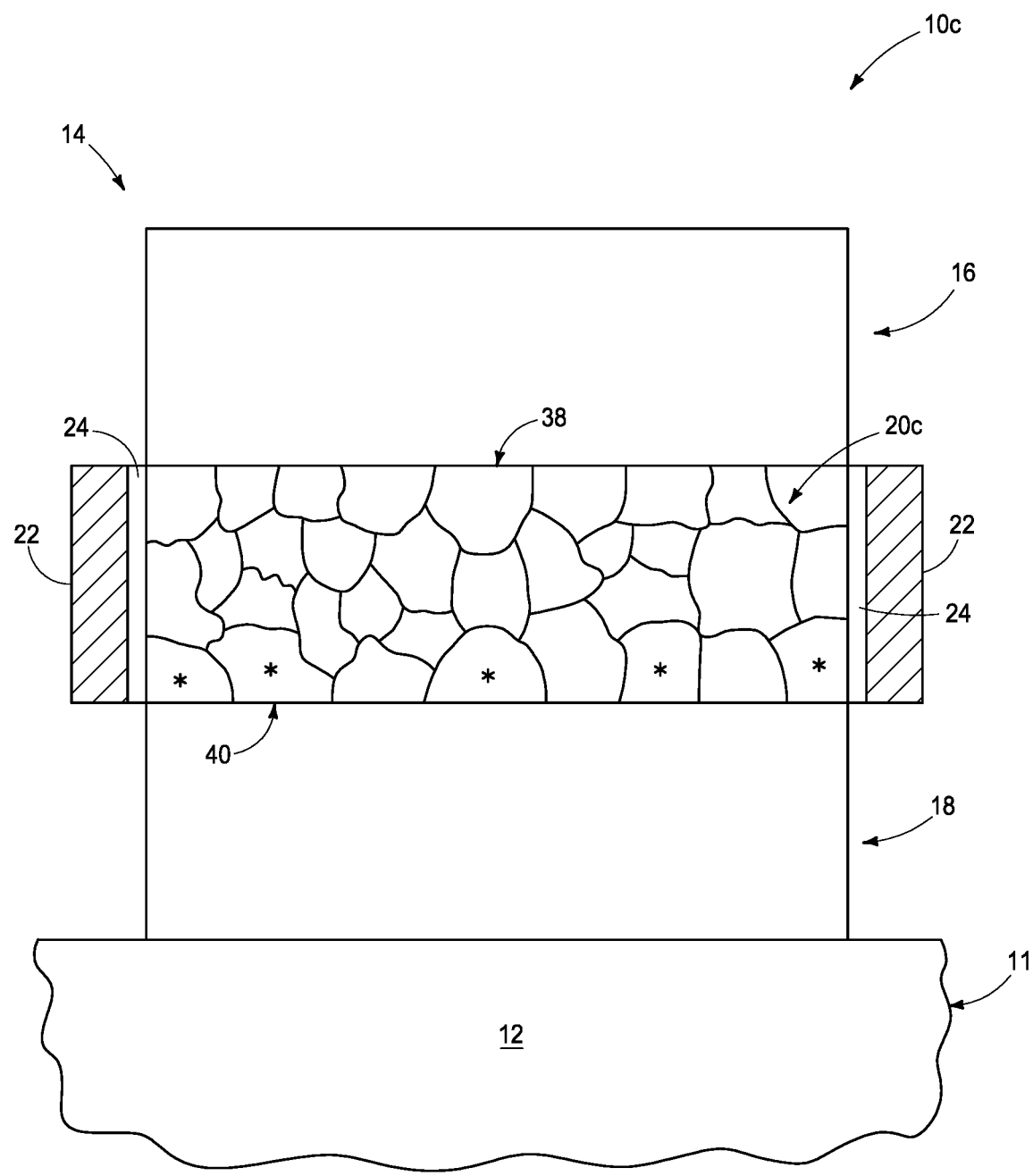
Figure 7:
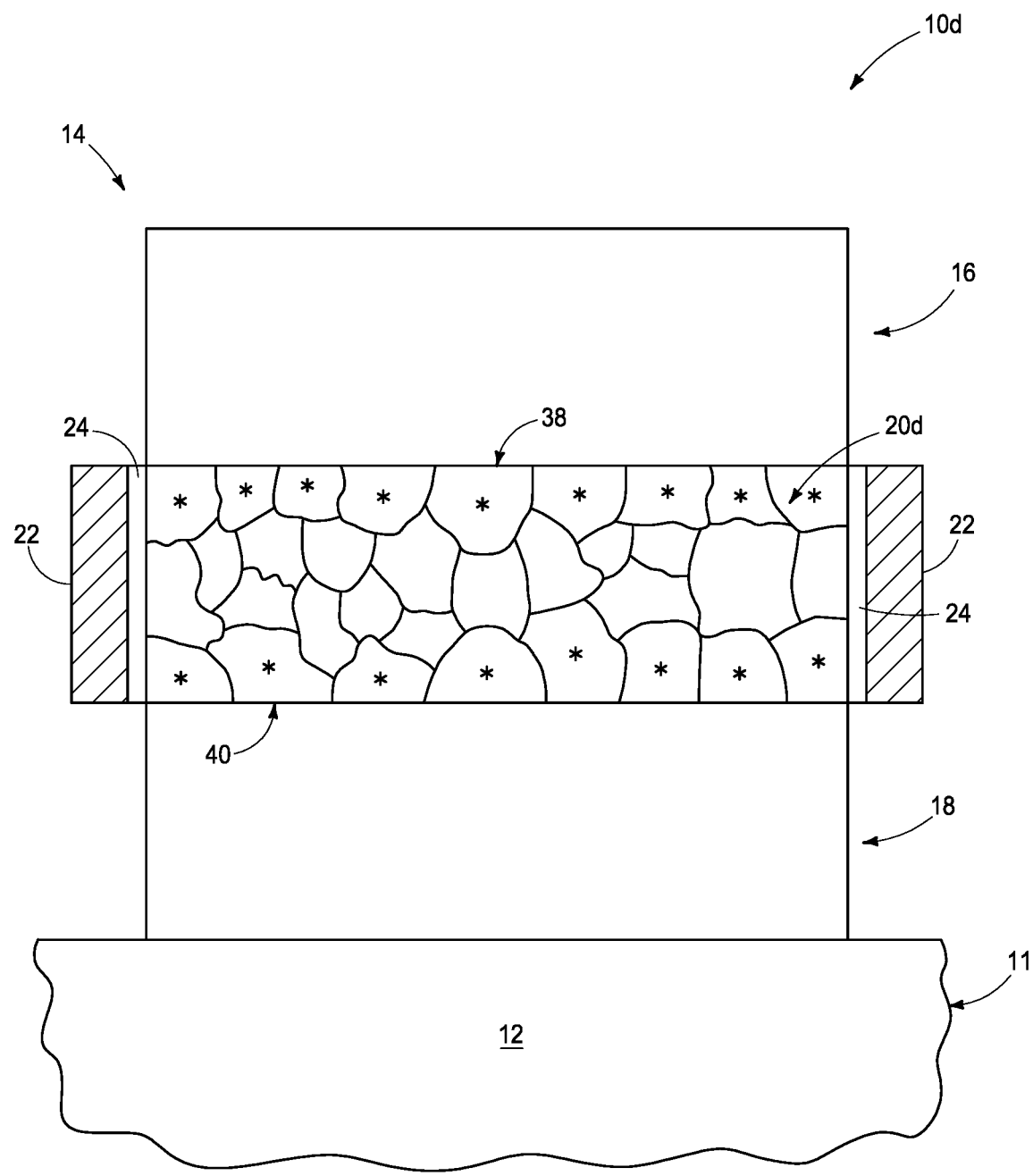
Figure 8:
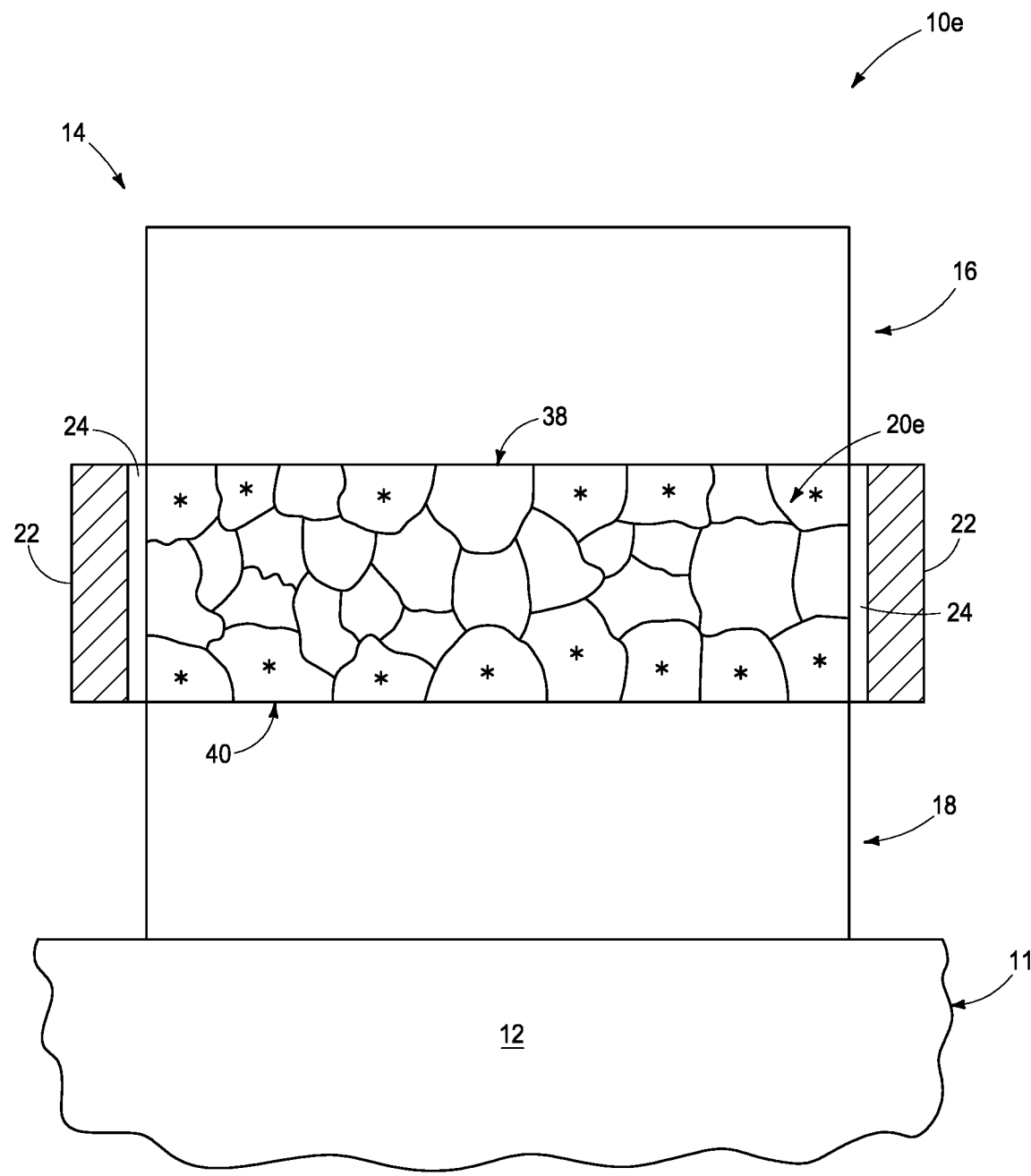
Figure 9:
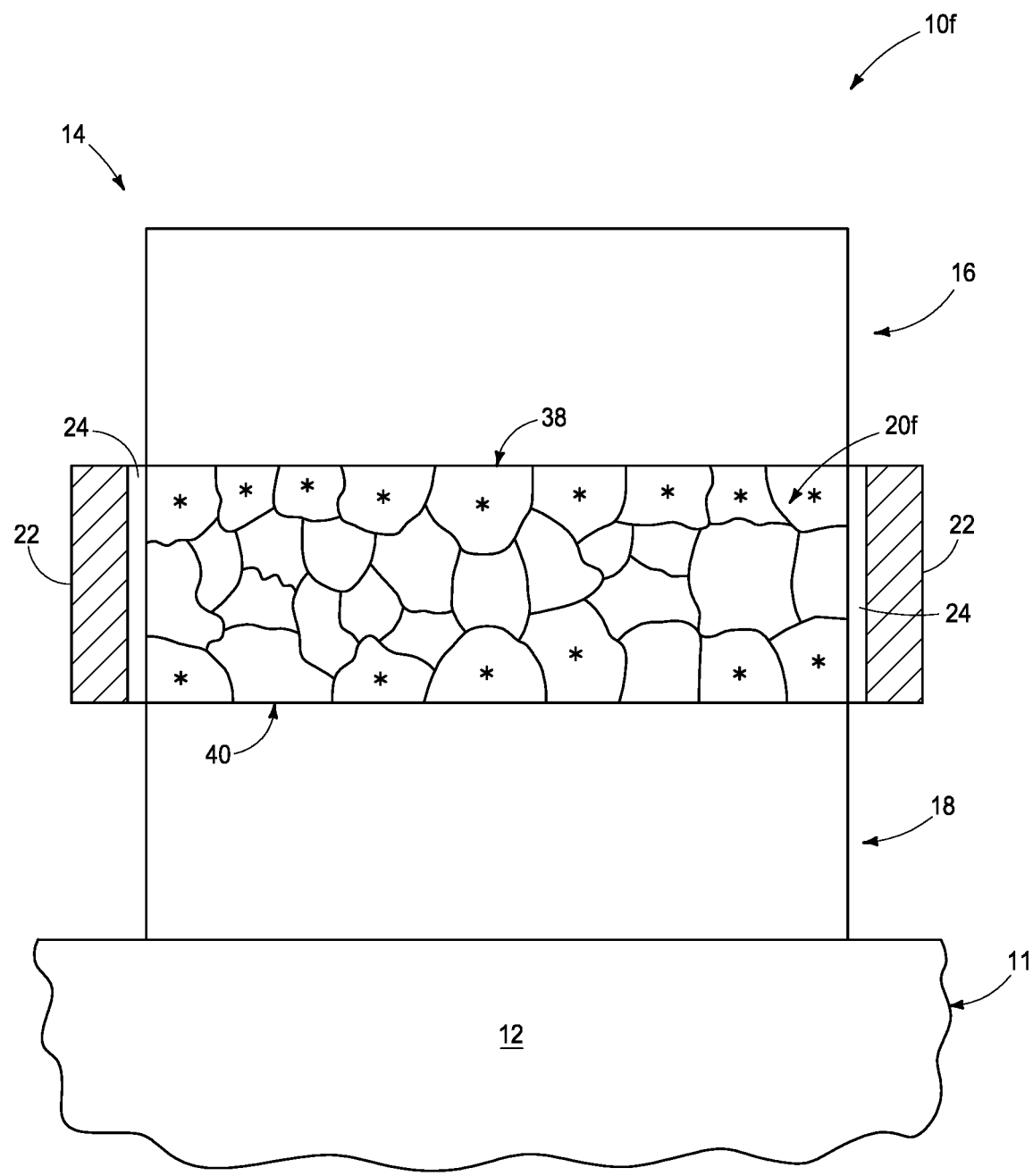
Figure 10:
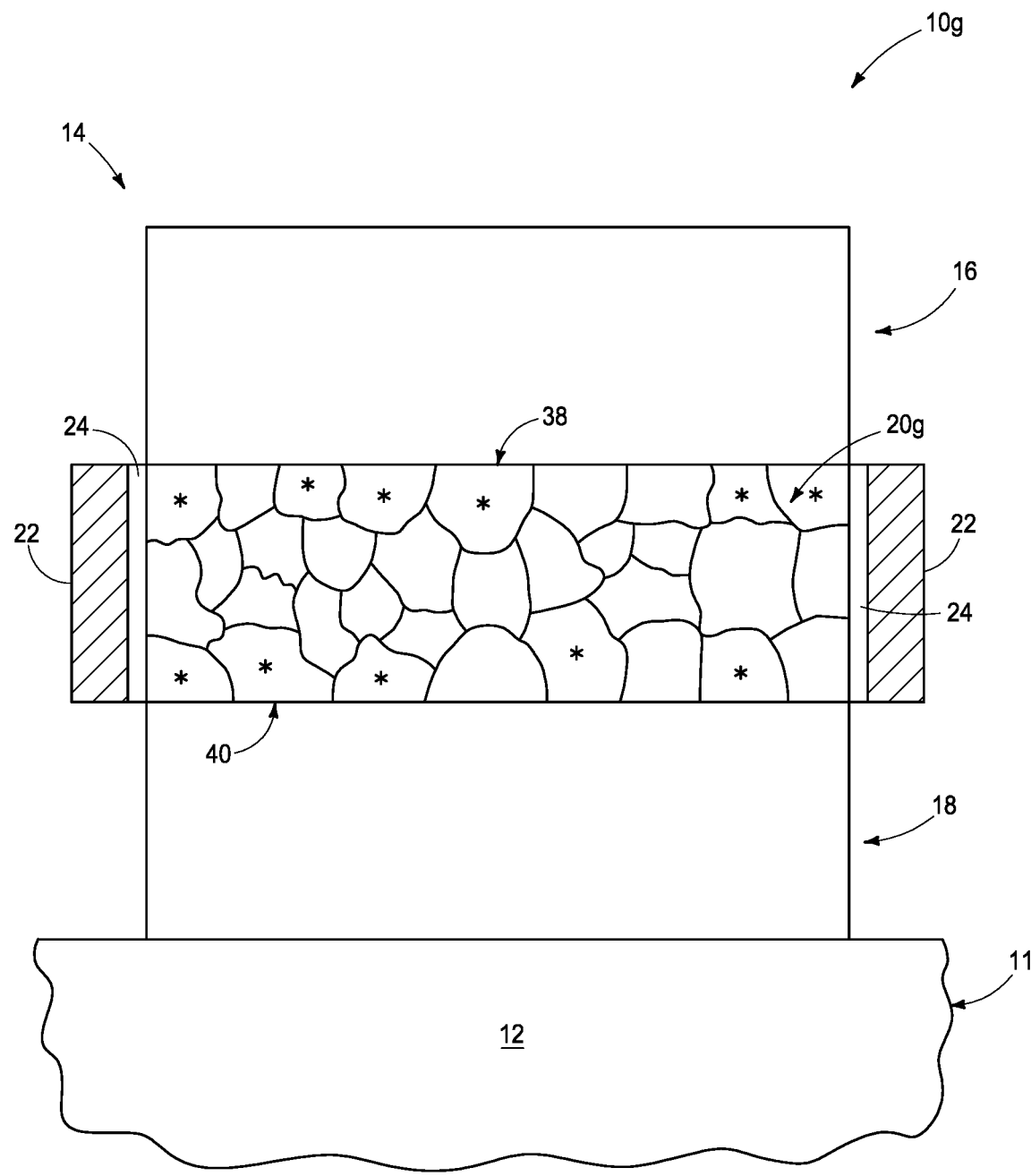
Figure 11:
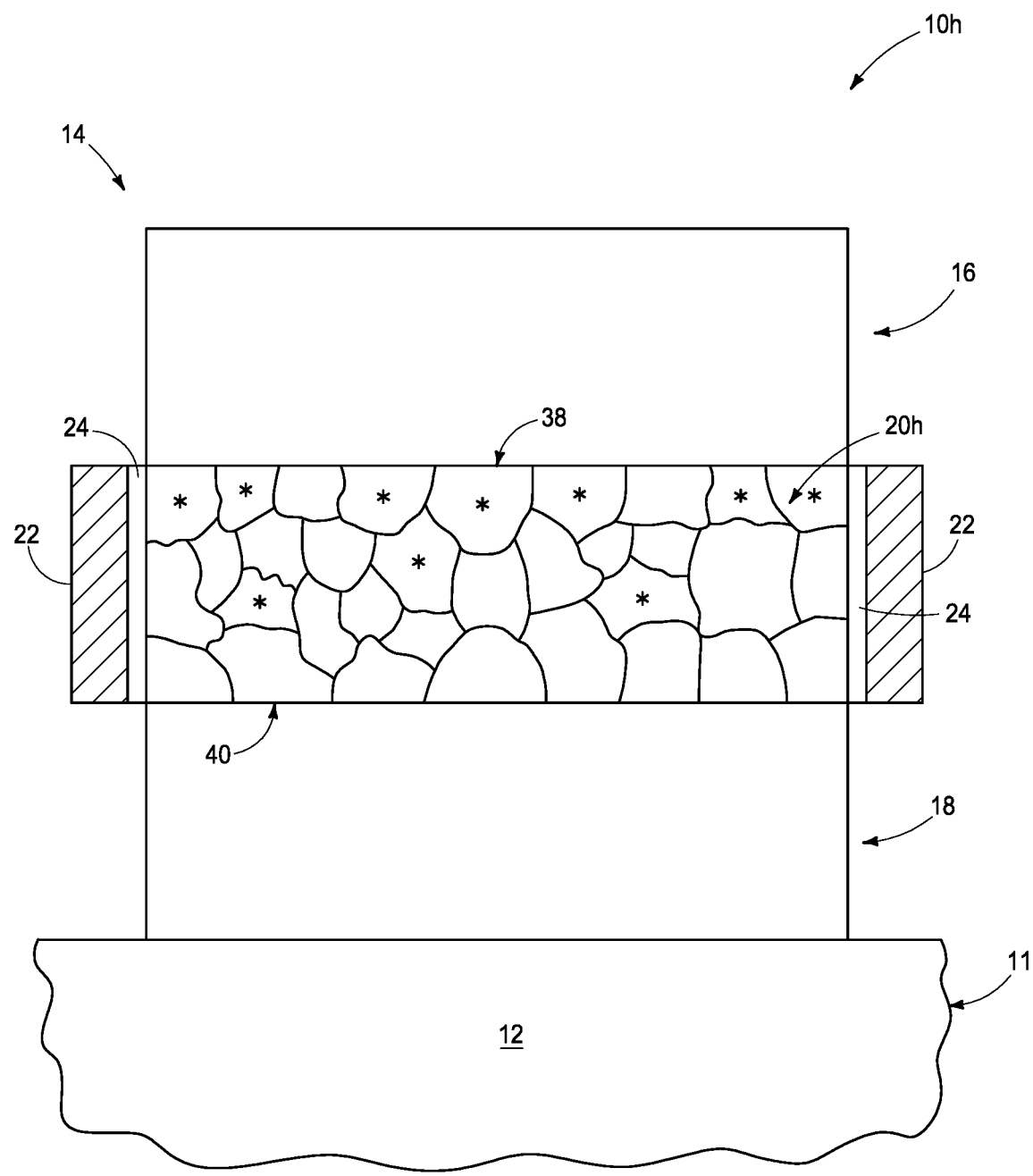
Figure 12:
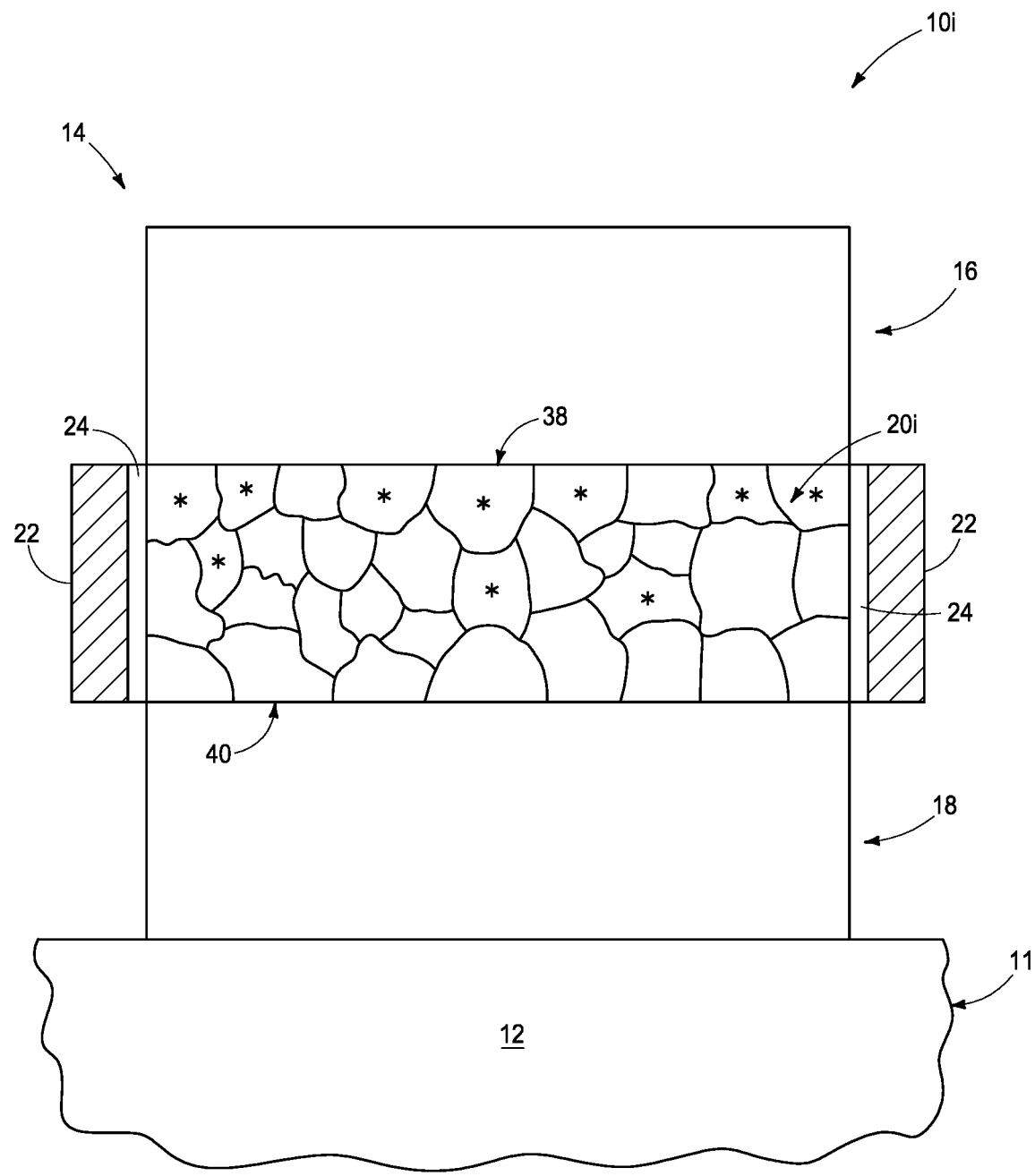
Figure 13:
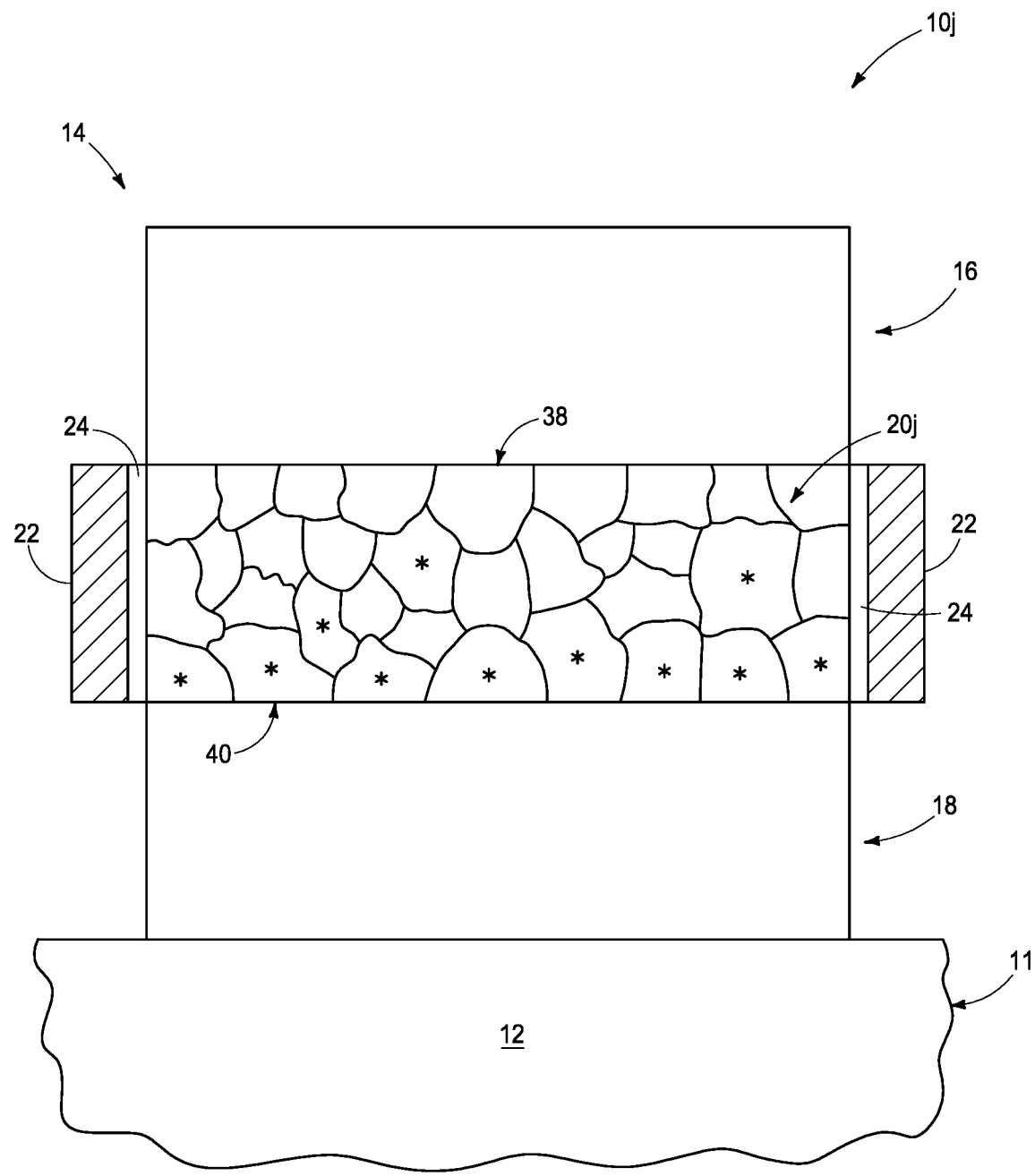
Figure 14:
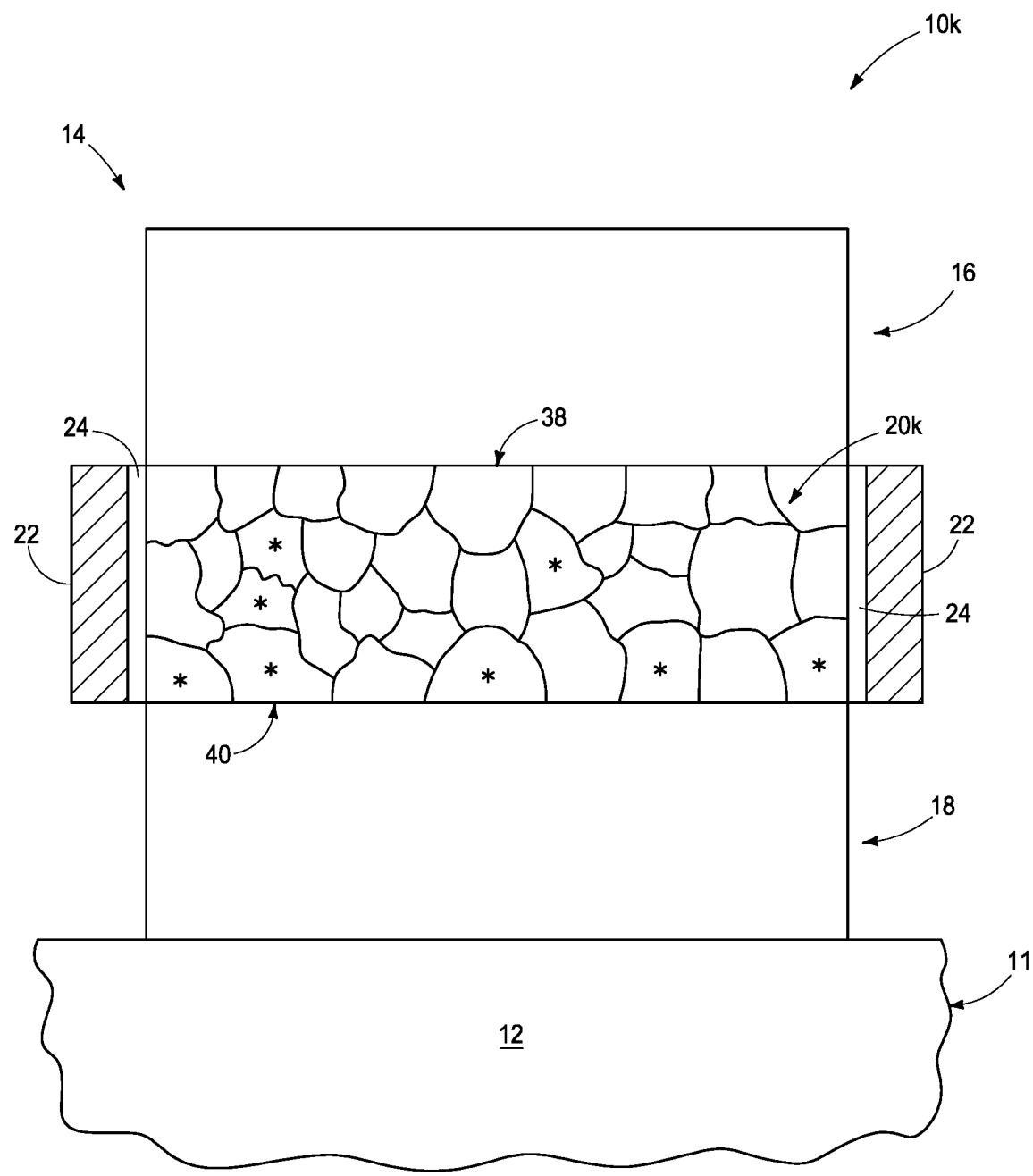
Figure 15:
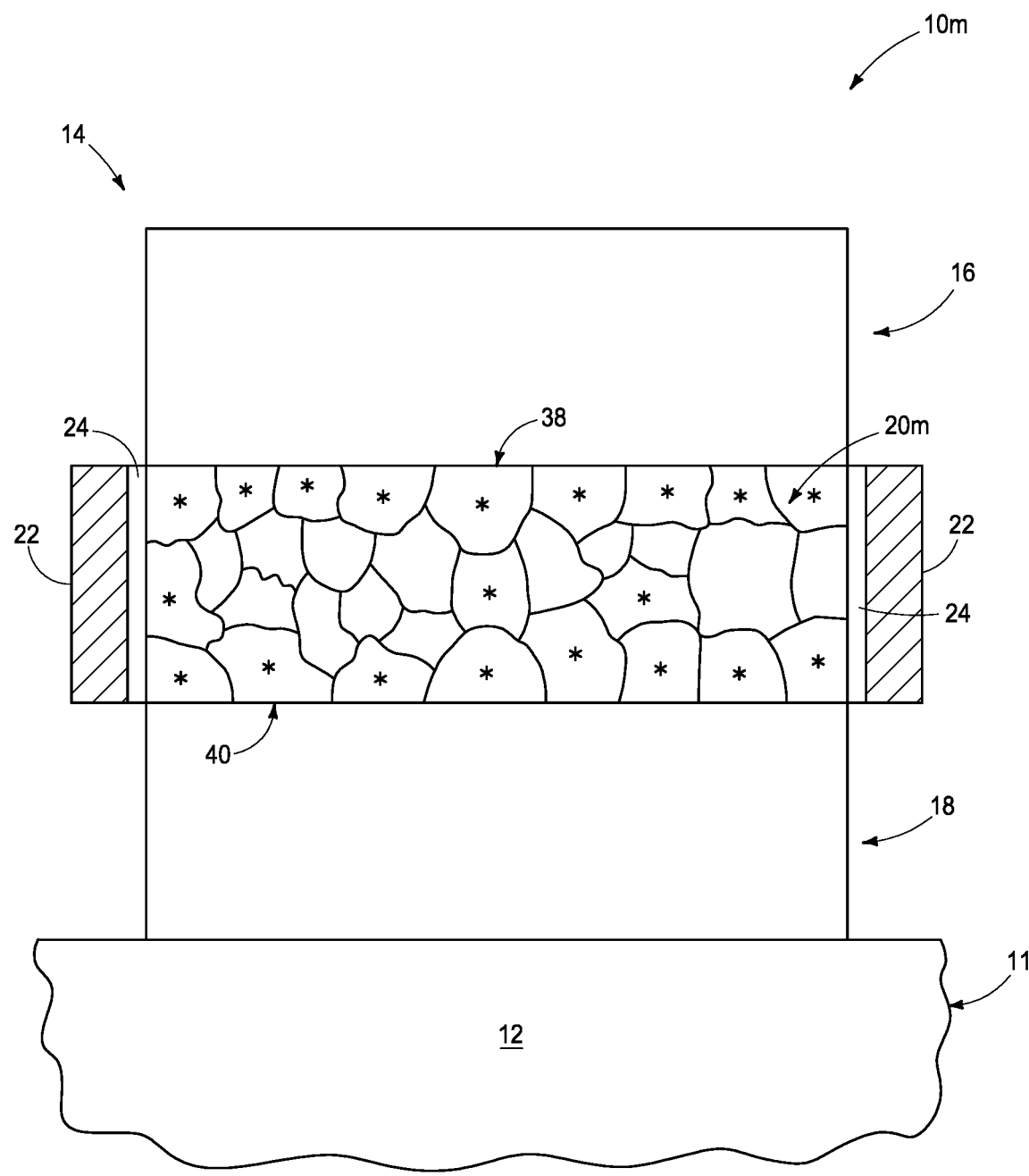
Figure 16:
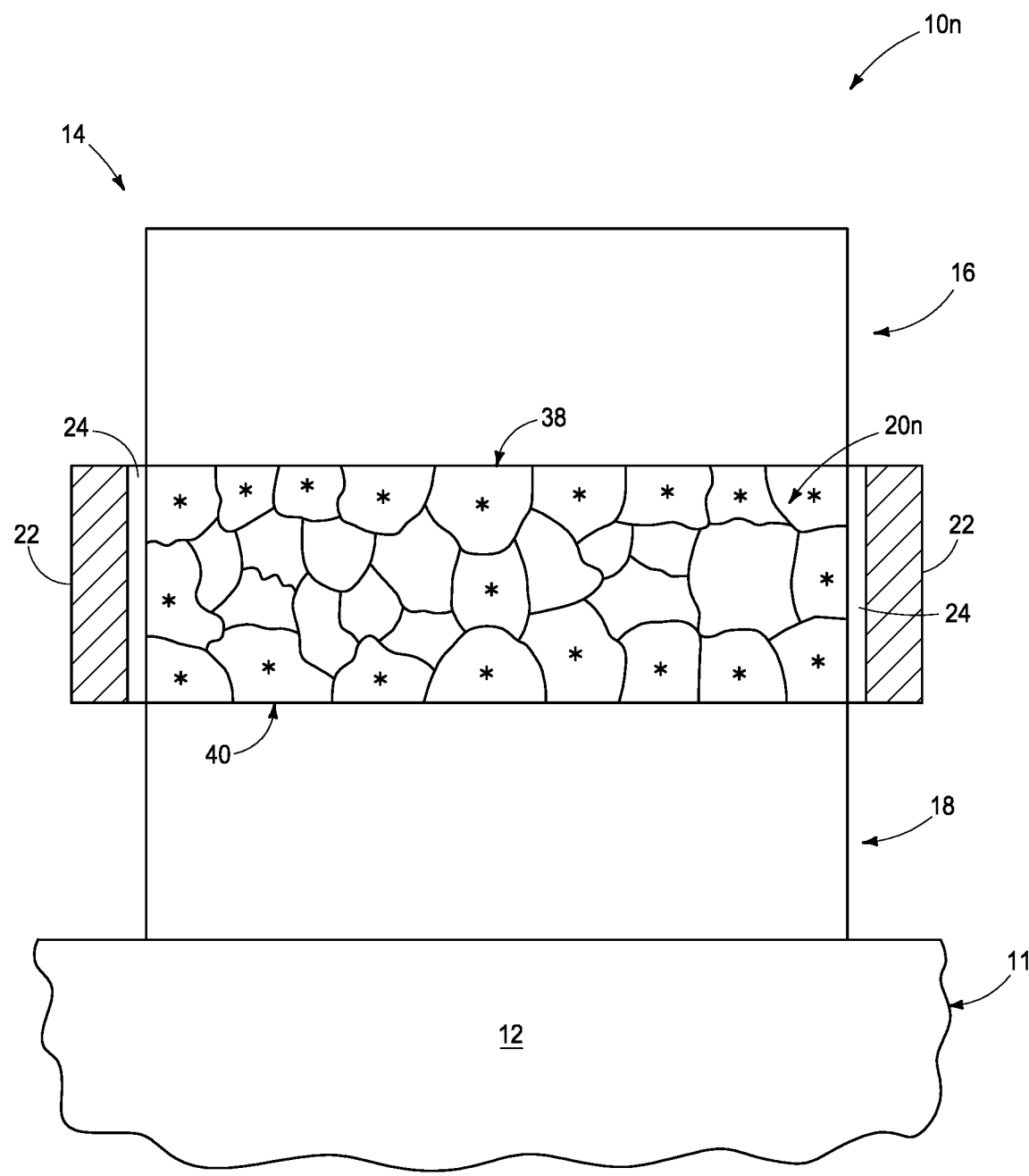
Figure 17:
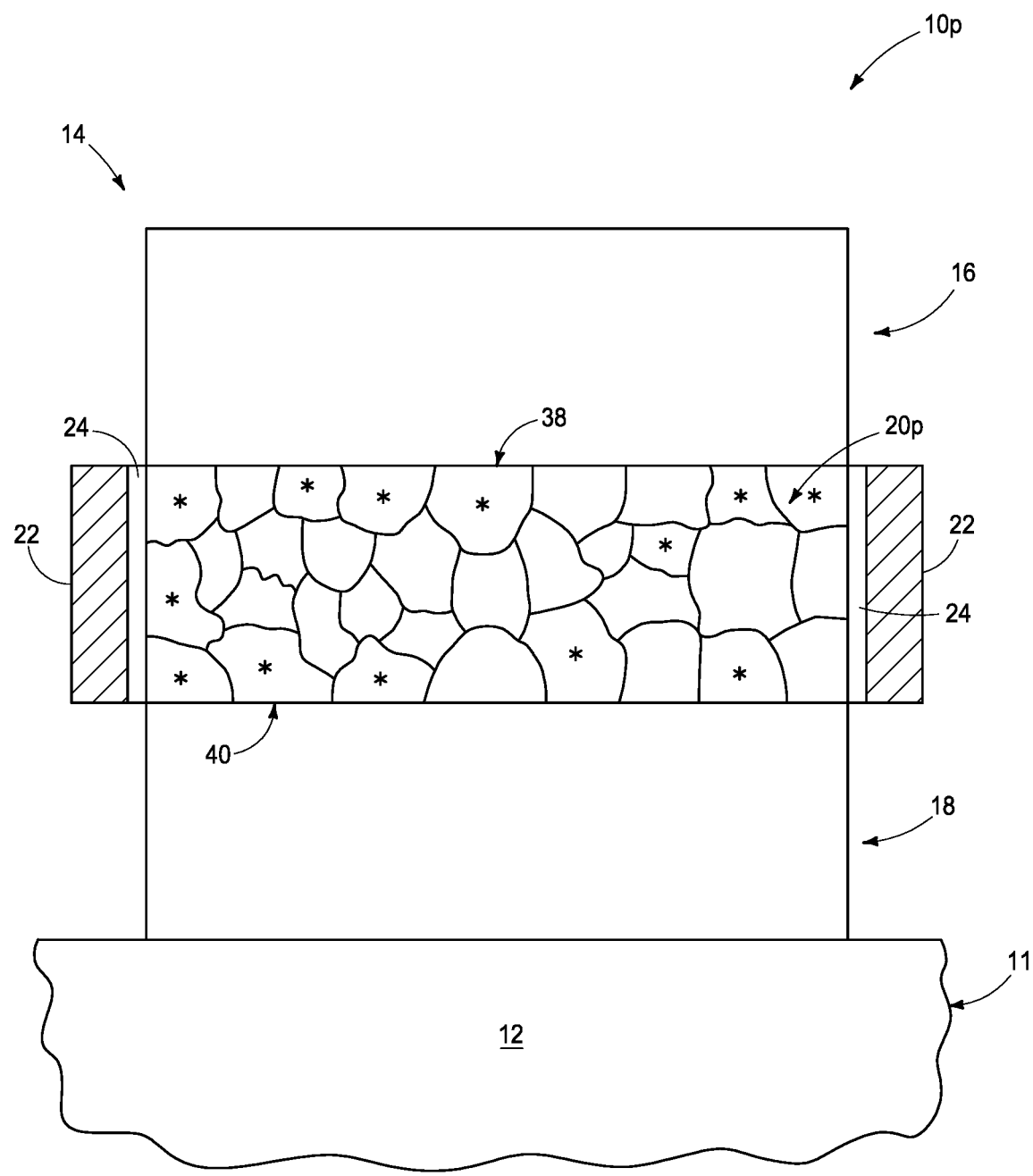

FIGS. 5 and 6 show analogous example embodiments constructions 10b and 10c, respectively, to that described above with respect to FIGS. 3 and 4, respectively, where a channel region 20b and a channel region 20c at bottom interface 40 individually have the greater horizontal texture. Like numerals from the above-described embodiments have been used where appropriate, with some construction differences being indicated with the suffix "b" or "c", respectively. Any other attribute(s) or aspect(s) as shown and/or described herein with respect to other embodiments may be used.

FIGS. 7, 8, 9, and 10 show alternate embodiment constructions 10d, 10e, 10f, and 10g, respectively, wherein channel region 20d, 20e, 20f, and 20g at both of top interface 38 and bottom interface 40 individually have the greater horizontal texture. Like numerals from the above-described embodiments have been used where appropriate, with some construction differences being indicated with the suffix "d,", "e", "f", or "g", respectively. In some such embodiments, amount of texture in channel region 20* (an * being used as a suffix to be inclusive of all such same-numerically-designated components that may or may not have other suffixes) at top interface 38 and amount horizontal texture in channel region 20* at bottom interface 40 are the same relative one another. Any other attribute(s) or aspect(s) as shown and/or described herein with respect to other embodiments may be used.

The above example embodiments show none of crystal grains 29 in channel region 20* that are vertically between crystal grains 30 that are at top interface 38 and at bottom interface 40 have horizontal texture/horizontal crystallographic planes. FIGS. 11, 12, 13, 14, 15, 16, and 17 show alternate example embodiment constructions 10h, 10i, 10j, 10k, 10m, 10n, and 10p, respectively, where some of crystal grains 29 in channel region 20* that are vertically between crystal grains 30 that are top interface 38 and bottom interface 40 have horizontal texture/horizontal crystallographic planes. Like numerals from the above-described embodiments have been used where appropriate, with some construction differences being indicated with the suffix "h,", "i", "j", "k", "m", "n", and "p", respectively. Any other attribute(s) or aspect(s) as shown and/or described herein with respect to other embodiments may be used.

Providing greater horizontal texture in channel region 20\* at interface 38 or 40 may improve conductivity between the respective source/drain region and the channel region (i.e., through such interface).

Any suitable methods may be used to produce channel regions as shown above, and which may be conducted before or after forming top source drain/region 16 (ideally before). One example includes laser annealing. By way of examples only, laser annealing may use a wavelength between 200 and 700 nanometers, power at 0.1 to 2 J/cm$^2$ (ideally, 0.5 to 2 J/cm$^2$), pulse width 5 to 250 nanoseconds, number of laser shots 1 to 100, and substrate temperature from room temperature to 450° C. Laser power for all anneals herein can be varied as selected by the artisan. Additionally, substrate temperature may be varied for different laser shots, as may laser pulse width. Multiple time-spaced laser annealing steps may be used. Alternately by way of example, the annealing may comprise microwave annealing. Example microwave annealing conditions include microwave power from 500 to 10,000 Watts, substrate temperature at room temperature to 600° C., an inert ambient (e.g., N$_2$, noble gas, etc.), pressure from 1 mTorr to atmospheric pressure, and time from 1 second to 12 hours. Multiple time-spaced microwave annealing steps may be used. The annealing may comprise any two or more of the above example annealing methods.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication and "exactly vertical" is 90° from exactly horizontal. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/material s/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a vertical transistor comprises a top source/drain region, a bottom source/drain region, a channel region vertically between the top and bottom source/drain regions, and a gate operatively laterally-adjacent the channel region. The top source/drain region and the channel region have a top interface and the bottom source/drain region and the channel region have a bottom interface. The channel region is crystalline and has an average crystal grain size of its crystal grains that is less than 20 nanometers. The channel region at the top interface or at the bottom interface has greater horizontal texture than volume of the crystal grains in the channel region that is vertically between the crystal grains that are at the top and bottom interfaces.

In some embodiments, a vertical transistor comprises a top source/drain region, a bottom source/drain region, a channel region vertically between the top and bottom source/drain regions, and a gate operatively laterally-adjacent the channel region. The top source/drain region and the channel region have a top interface and the bottom source/drain region and the channel region have a bottom interface. The channel region is crystalline and has an average crystal grain size of its crystal grains from 5 nanometers to 10 nanometers. The channel region at the top interface has greater horizontal texture than volume of the crystal grains in the channel region that is vertically between the crystal grains that are at the top and bottom interfaces.

In some embodiments, a vertical transistor comprises a top source/drain region, a bottom source/drain region, a channel region vertically between the top and bottom source/drain regions, and a gate operatively laterally-adjacent the channel region. The top source/drain region and the channel region have a top interface and the bottom source/drain region and the channel region have a bottom interface. The channel region is crystalline and has an average crystal grain size of its crystal grains from 5 nanometers to 10 nanometers. The channel region at the bottom interface has greater horizontal texture than volume of the crystal grains in the channel region that is vertically between the crystal grains that are at the top and bottom interfaces.

In some embodiments, a vertical transistor comprises a top source/drain region, a bottom source/drain region, a channel region vertically between the top and bottom source/drain regions, and a gate operatively laterally-adjacent the channel region. The top source/drain region and the channel region have a top interface and the bottom source/drain region and the channel region having a bottom interface. The channel region is crystalline and has an average crystal grain size of its crystal grains that is from 5 nanometers to 10 nanometers. At least some of the crystal grains in the channel region at the top interface, at least some of the crystal grains in the channel region at the bottom interface, and at least some of the crystal grains of the channel region that are vertically between the crystal grains that are at the top and bottom interfaces have horizontal texture. The channel region at the top and bottom interfaces has greater horizontal texture than volume of the crystal grains that are vertically between the crystal grains that are at the top and bottom interfaces.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A vertical transistor comprising:
   a top source/drain region, a bottom source/drain region, a channel region vertically between the top and bottom source/drain regions, and a gate operatively laterally-adjacent the channel region, the top source/drain region and the channel region having a top interface, the bottom source/drain region and the channel region having a bottom interface;

the channel region being crystalline and having an average crystal grain size of its crystal grains that is less than 20 nanometers; and the channel region at the top interface or at the bottom interface having greater horizontal texture than volume of the crystal grains in the channel region that is vertically between the crystal grains that are at the top and bottom interfaces.

2. The vertical transistor of claim 1 wherein the average crystal grain size of the channel region is no greater than 15 nanometers.

3. The vertical transistor of claim 2 wherein the average crystal grain size of the channel region is no greater than 10 nanometers.

4. The vertical transistor of claim 1 wherein the average crystal grain size of the channel region is no less than 5 nanometers.

5. The vertical transistor of claim 1 wherein the average crystal grain size of the channel region is from 5 nanometers to 15 nanometers.

6. The vertical transistor of claim 1 wherein the top and bottom source/drain regions are crystalline.

7. The vertical transistor of claim 1 wherein all of the crystal grains in the channel region at the top interface or at the bottom interface have horizontal texture.

8. The vertical transistor of claim 1 wherein less-than-all of the crystal grains in the channel region at the top interface or at the bottom interface have horizontal texture.

9. The vertical transistor of claim 1 wherein the channel region at the top interface has the greater horizontal texture.

10. The vertical transistor of claim 1 wherein the channel region at the bottom interface has the greater horizontal texture.

11. The vertical transistor of claim 1 wherein the channel region at only one of the top and bottom interfaces has the greater horizontal texture.

12. The vertical transistor of claim 11 wherein the channel region at the top interface has the greater horizontal texture.

13. The vertical transistor of claim 11 wherein the channel region at the bottom interface has the greater horizontal texture.

14. The vertical transistor of claim 1 wherein the channel region at both of the top and bottom interfaces has the greater horizontal texture.

15. The vertical transistor of claim 1 wherein some of the crystal grains in the volume of the channel region that is vertically between the crystal grains that are at the top and bottom interfaces have horizontal texture.

16. The vertical transistor of claim 1 wherein none of the crystal grains in the volume of the channel region that is vertically between the crystal grains that are at the top and bottom interfaces have horizontal texture.

17. The vertical transistor of claim 1 wherein the greater horizontal texture is exactly horizontal and the vertical transistor is exactly vertical.

18. A vertical transistor comprising:
a top source/drain region, a bottom source/drain region, a channel region vertically between the top and bottom source/drain regions, and a gate operatively laterally-adjacent the channel region, the top source/drain region and the channel region having a top interface, the bottom source/drain region and the channel region having a bottom interface;

the channel region being crystalline and having an average crystal grain size of its crystal grains from 5 nanometers to 10 nanometers; and the channel region at the top interface having greater horizontal texture than volume of the crystal grains in the channel region that is vertically between the crystal grains that are at the top and bottom interfaces.

19. The vertical transistor of claim 18 wherein all of the crystal grains in the channel region at the top interface have horizontal texture.

20. The vertical transistor of claim 18 wherein less-than-all of the crystal grains in the channel region at the top interface have horizontal texture.

21. The vertical transistor of claim 18 wherein the greater horizontal texture is exactly horizontal and the vertical transistor is exactly vertical.

22. A vertical transistor comprising:
a top source/drain region, a bottom source/drain region, a channel region vertically between the top and bottom source/drain regions, and a gate operatively laterally-adjacent the channel region, the top source/drain region and the channel region having a top interface, the bottom source/drain region and the channel region having a bottom interface;

the channel region being crystalline and having an average crystal grain size of its crystal grains from 5 nanometers to 10 nanometers; and the channel region at the bottom interface having greater horizontal texture than volume of the crystal grains in the channel region that is vertically between the crystal grains that are at the top and bottom interfaces.

23. The vertical transistor of claim 22 wherein all of the crystal grains in the channel region at the bottom interface have horizontal texture.

24. The vertical transistor of claim 22 wherein less-than-all of the crystal grains in the channel region at the bottom interface have horizontal texture.

25. The vertical transistor of claim 22 wherein the greater horizontal texture is exactly horizontal and the vertical transistor is exactly vertical.

26. A vertical transistor comprising:
a top source/drain region, a bottom source/drain region, a channel region vertically between the top and bottom source/drain regions, and a gate operatively laterally-adjacent the channel region, the top source/drain region and the channel region having a top interface, the bottom source/drain region and the channel region having a bottom interface;

the channel region being crystalline and having an average crystal grain size of its crystal grains that is from 5 nanometers to 10 nanometers; and at least some of the crystal grains in the channel region at the top interface, at least some of the crystal grains in the channel region at the bottom interface, and at least some of the crystal grains of the channel region that are vertically between the crystal grains that are at the top and bottom interfaces having horizontal texture; the channel region at the top and bottom interfaces having greater horizontal texture than volume of the crystal grains that are vertically between the crystal grains that are at the top and bottom interfaces.

27. The vertical transistor of claim 26 wherein amount of horizontal texture in the channel region at the top interface and amount of horizontal texture in the channel region at the bottom interface are the same relative one another.

28. The vertical transistor of claim 26 wherein the greater horizontal texture is exactly horizontal and the vertical transistor is exactly vertical.

* * * * *